United States Patent
Ma et al.

(10) Patent No.: US 8,673,758 B2
(45) Date of Patent: Mar. 18, 2014

(54) STRUCTURE OF METAL GATE AND FABRICATION METHOD THEREOF

(75) Inventors: Cheng-Yu Ma, Tainan (TW); Wen-Han Hung, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/161,512

(22) Filed: Jun. 16, 2011

(65) Prior Publication Data
US 2012/0319214 A1 Dec. 20, 2012

(51) Int. Cl.
*H01L 21/3205* (2006.01)
*H01L 29/78* (2006.01)

(52) U.S. Cl.
USPC .................. 438/591; 257/369; 438/585

(58) Field of Classification Search
CPC .............. H01L 21/02175; H01L 21/76829; H01L 29/66545
USPC .......... 438/592, 270, 591; 257/E27.091, 369
See application file for complete search history.

(56) References Cited

U.S. PATENT DOCUMENTS

| | | | |
|---|---|---|---|
| 6,066,533 A | 5/2000 | Yu | |
| 6,335,239 B1* | 1/2002 | Agahi et al. | 438/245 |
| 6,492,217 B1 | 12/2002 | Bai | |
| 6,552,377 B1 | 4/2003 | Yu | |
| 6,696,345 B2 | 2/2004 | Chau | |
| 6,790,719 B1 | 9/2004 | Adetutu | |
| 6,794,234 B2 | 9/2004 | Polishchuk | |
| 6,902,969 B2 | 6/2005 | Adetutu | |
| 6,921,711 B2 | 7/2005 | Cabral, Jr. | |
| 7,030,430 B2 | 4/2006 | Doczy | |
| 7,074,664 B1 | 7/2006 | White | |
| 7,109,079 B2 | 9/2006 | Schaeffer, III | |
| 7,126,199 B2 | 10/2006 | Doczy | |
| 7,157,378 B2 | 1/2007 | Brask | |
| 7,193,893 B2 | 3/2007 | Forbes | |
| 7,208,366 B2 | 4/2007 | Tsai | |
| 7,381,619 B2 | 6/2008 | Wang | |
| 7,390,709 B2 | 6/2008 | Doczy | |
| 7,488,656 B2 | 2/2009 | Cartier | |
| 7,785,958 B2 | 8/2010 | Doczy | |
| 2002/0127888 A1 | 9/2002 | Cho | |
| 2004/0082125 A1* | 4/2004 | Hou et al. | 438/240 |
| 2005/0095763 A1 | 5/2005 | Samavedam | |
| 2005/0202659 A1 | 9/2005 | Li | |
| 2005/0275035 A1 | 12/2005 | Mathew | |
| 2006/0040482 A1 | 2/2006 | Yang | |
| 2006/0054943 A1 | 3/2006 | Li | |
| 2007/0037335 A1 | 2/2007 | Chambers | |
| 2007/0082445 A1 | 4/2007 | Yang | |
| 2007/0138559 A1 | 6/2007 | Bohr | |
| 2007/0148838 A1 | 6/2007 | Doris | |
| 2007/0210354 A1 | 9/2007 | Nabatame | |
| 2007/0262348 A1* | 11/2007 | Park et al. | 257/204 |

(Continued)

*Primary Examiner* — Kevin Parendo
*Assistant Examiner* — Pauline Vu
(74) *Attorney, Agent, or Firm* — Winston Hsu; Scott Margo (57) ABSTRACT

A method for fabricating a metal gate includes the following steps. First, a substrate having an interfacial dielectric layer above the substrate is provided. Then, a gate trench having a barrier layer is formed in the interfacial dielectric layer. A source layer is disposed above the barrier layer. Next, a process is performed to have at least one element in the source layer move into the barrier layer. Finally, the source layer is removed and a metal layer fills up the gate trench.

14 Claims, 10 Drawing Sheets

(56) References Cited

U.S. PATENT DOCUMENTS

| | | |
|---|---|---|
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2009/0184378 A1* | 7/2009 | Zhu et al. ............... 257/387 |
| 2009/0230479 A1* | 9/2009 | Hsu et al. ............... 257/369 |
| 2010/0001323 A1* | 1/2010 | Tateshita ............... 257/288 |
| 2010/0052066 A1* | 3/2010 | Yu et al. ............... 257/369 |
| 2010/0052074 A1 | 3/2010 | Lin |
| 2010/0068877 A1* | 3/2010 | Yeh et al. ............... 438/592 |
| 2010/0081262 A1* | 4/2010 | Lim et al. ............... 438/479 |
| 2010/0127336 A1* | 5/2010 | Chambers et al. ............... 257/369 |
| 2010/0327365 A1* | 12/2010 | Iwamoto ............... 257/369 |

* cited by examiner

STRUCTURE OF METAL GATE AND FABRICATION METHOD THEREOF

BACKGROUND OF THE INVENTION

1. Field of the Invention

The invention generally relates to a structure of a metal gate and a fabrication method thereof. More particularly, the invention relates to a structure and a fabrication method of a gate-last metal gate.

2. Description of the Prior Art

With a trend towards scaling down the size of semiconductor devices, conventional methods used to achieve optimization, such as reducing thickness of the gate dielectric layer (for example, the thickness of a silicon dioxide layer) have faced problems such as leakage current due to tunneling effect. In order to continue the progression towards the next generation, high-K materials are used to replace the conventional silicon oxide to be the gate dielectric layer because they can decrease physical limit thickness effectively, reduce leakage current, and obtain an equivalent capacitance in an identical equivalent oxide thickness (EOT).

A conventional polysilicon gate also has certain disadvantages, such as inferior performance due to boron penetration, and an unavoidable depletion effect, which increases the equivalent thickness of the gate dielectric layer, reduces gate capacitance, and worsens a driving force of devices. Thus, work function metals have been developed to replace the conventional polysilicon gate to be the control electrode that is competent to the high-K gate dielectric layer.

There is always a continuing need in the semiconductor processing art to develop semiconductor devices which have a superior performance and reliability even though the conventional silicon dioxide or silicon oxynitride gate dielectric layer is replaced by a high-K gate dielectric layer and the conventional polysilicon gate is replaced by a metal gate.

SUMMARY OF THE INVENTION

It is an objective of the invention to provide a structure of a metal gate and a fabrication method thereof which is capable of maintaining the work function value of an NMOS during the on-state and eliminating the gate leakage current in the NMOS.

According to a preferred embodiment of the present invention, the invention provides a method for fabricating a metal gate. First, a substrate having an interfacial dielectric layer on a substrate is provided. Then, a gate trench is formed in the interfacial dielectric layer, wherein the gate trench has a barrier layer. A source layer is formed on the barrier layer. Next, at least an element is driven from the source layer into the barrier layer. The source layer is removed. Finally, the gate trench is filled up with a metal layer.

According to another aspect of the present invention, the invention provides a method for fabricating a metal gate. First, a substrate having an interfacial layer on it is provided, wherein the substrate is divided into a first region and a second region. Then, at least a gate trench is formed in the interfacial layer within both the first region and the second region, respectively, wherein the gate trenches have a barrier layer. Next, a source layer is formed in the gate trench within the first region, wherein the source layer is disposed on the barrier layer. At least an element in the source layer is driven into the barrier layer. The source layer is removed. Finally, the gate trenches are filled up with a metal layer.

Another aspect of the present invention is to provide a metal gate on the substrate, which includes a high-k dielectric layer disposed on the substrate, a barrier layer disposed on the high-k dielectric layer, a work function metal layer disposed in the barrier layer, and a metal layer disposed on the work function metal layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings may be exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Figure 1:
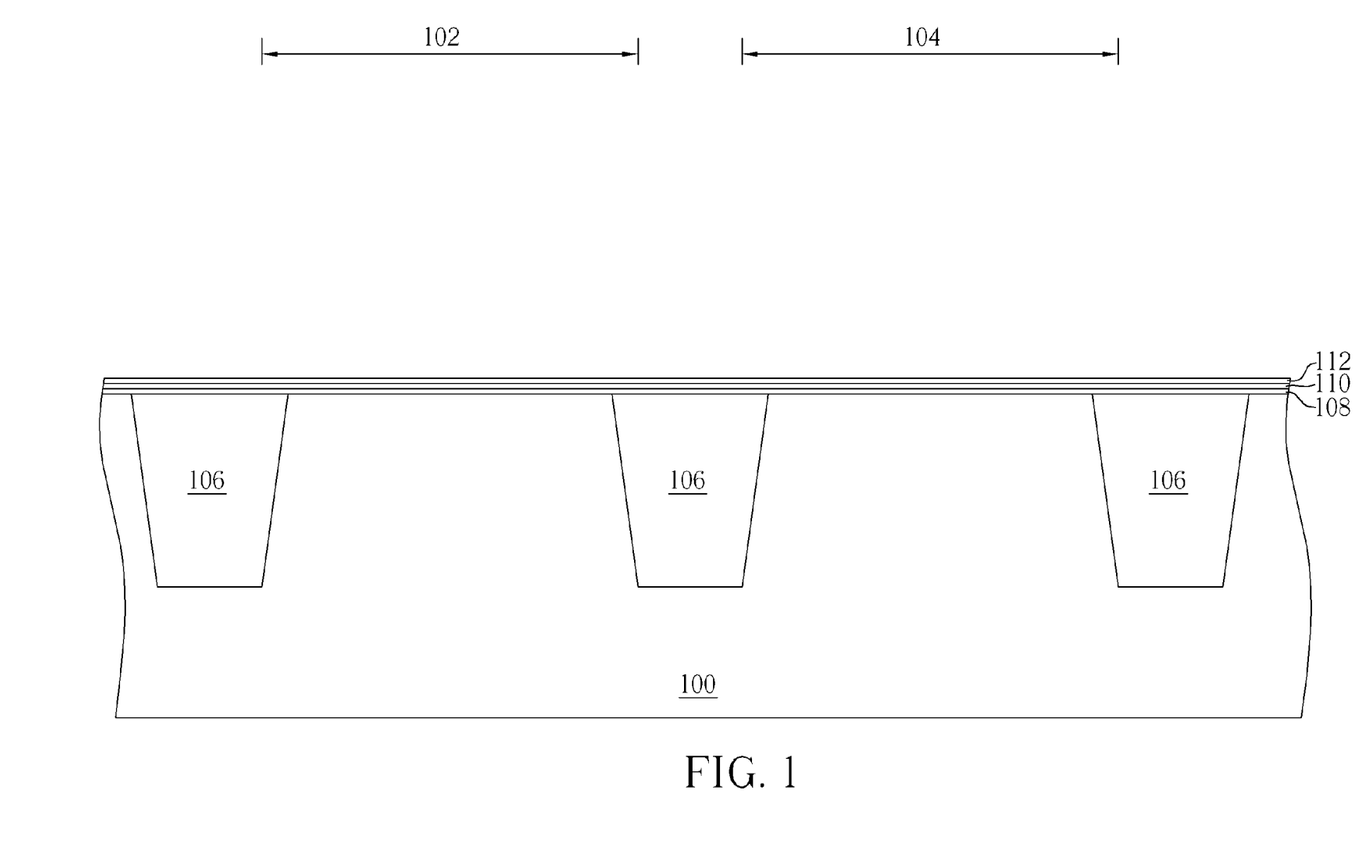
FIGS. 1-8 are schematic, cross-sectional diagrams illustrating a method for fabricating a metal gate in accordance with one embodiment of the invention.

Please refer to FIGS. 1-8, which illustrate a method for fabricating a semiconductor device having a metal gate according to a preferred embodiment of the present invention. In this embodiment, the semiconductor device is preferably a CMOS transistor and the method preferably utilizes a gate-last approach accompanying a high-k first fabrication. As shown in FIG. 1, a substrate 100, such as a silicon substrate or a silicon-on-insulator (SOI) substrate is provided. A first region and a second region are defined on the substrate 100, such as a NMOS region 102 and a PMOS region 104. A plurality of shallow trench isolations (STI) 106 is formed in the substrate 100 for separating the two transistor regions.

An interfacial dielectric layer 108 composed of dielectric material such as oxides or nitrides is selectively formed on the surface of the substrate 100, and a stacked film composed of a high-k dielectric layer 110, and a barrier layer 112 is formed on the interfacial dielectric layer 108.

In this embodiment, the high-k dielectric layer 110 could be a single-layer or a multi-layer structure containing a metal oxide layer such as a rare earth metal oxide, in which the dielectric constant of the high-k dielectric layer 110 is substantially greater than 20. As an example, the high-k dielectric layer 110 could be selected from the group consisting of hafnium oxide ($HfO_2$), hafnium silicon oxide (HfSiO or HfSiO$_4$), hafnium silicon oxynitride (HfSiON), aluminum oxide (AlO or Al$_2$O$_3$), lanthanum oxide (La$_2$O$_3$), lanthanum aluminum oxide (LaAlO), tantalum oxide (Ta$_2$O$_3$), yttrium oxide (Y$_2$O$_3$), zirconium oxide (ZrO$_2$), strontium titanium oxide (SrTiO$_3$) zirconium silicon oxide (ZrSiO or ZrSiO$_4$), hafnium zirconium oxide (HfZrO or HfZrO$_4$), strontium bismuth tantalite ( SrBi$_2$Ta$_2$O$_9$, SBT), lead zirconate titanate (PbZr$_x$Ti$_{1-x}$O$_3$ PZT), and barium strontium titanate (PbZr$_x$Ti$_{1-x}$O$_3$ BST). Preferably, the barrier layer 112 is composed of TiN and the thickness therein must be greater than 20 angstroms to meet the demands of the following procedure.

Figure 2:
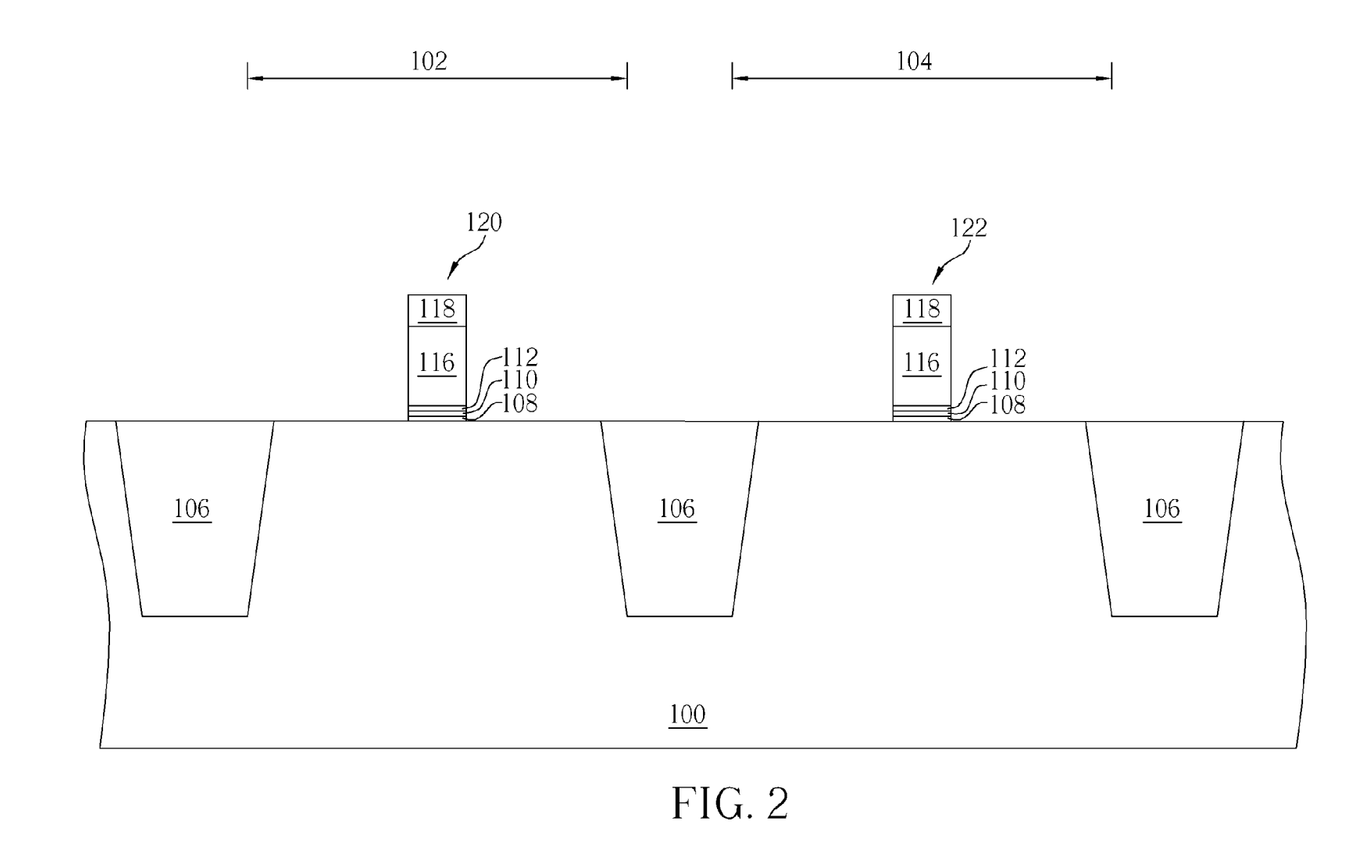

Next, as shown in FIG. 2, a polysilicon layer 116 and a hard mask 118 are formed in sequence on the surface of the barrier layer 112, and a pattern transfer is conducted by using a patterned resist (not shown) as a mask to partially remove the hard mask 118, the polysilicon layer 116, the barrier layer 112, the high-k dielectric layer 110, and the interfacial dielectric layer 108 through single or multiple etching processes. After stripping the patterned resist, a first gate structure 120 and a second gate structure 122, which serve as dummy gate or replacement gate structures, are formed on the NMOS region 102 and the PMOS region 104, respectively.

Preferably, the polysilicon layer 116 is used as a sacrificial layer, which could be composed of undoped polysilicon, polysilicon having n$^+$ dopants, or amorphous polysilicon material. The hard mask 118 could be composed of SiO$_2$, SiN, SiC, or SiON.

Figure 3:
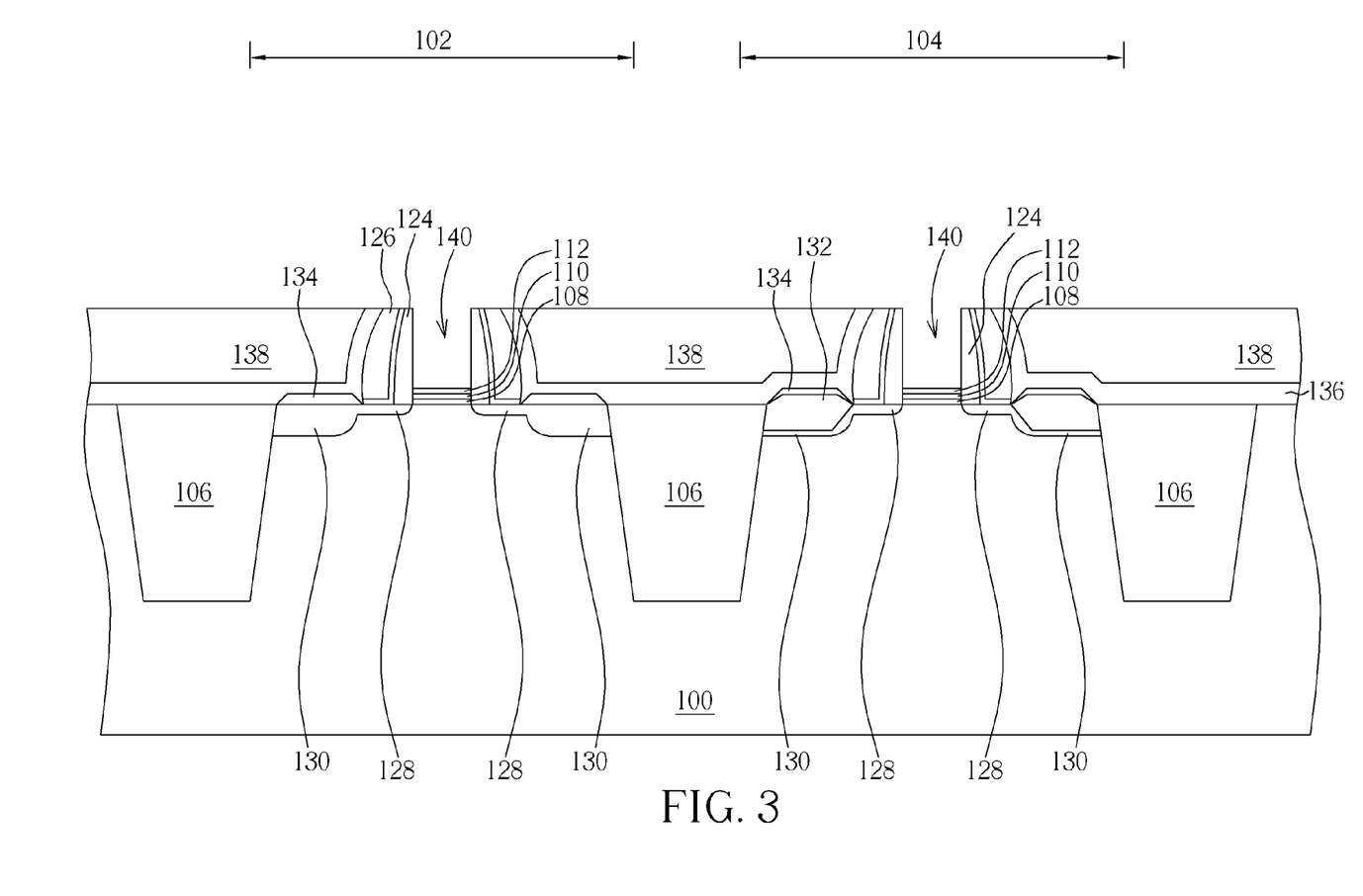

As shown in FIG. 3, a first spacer 124 and a second spacer 126 are formed on the sidewall of the first gate structure 120 and the second gate structure 122, respectively, and a lightly doped drain 128 and source/drain 130 are formed in the substrate 100 adjacent to two sides of the first spacer 124 and the second spacer 126.

A selective epitaxial growth process is selectively carried out on the PMOS and/or NMOS, such as to form an epitaxial layer 132 in the substrate 100 adjacent to two sides of the second spacer 126 of the PMOS region 104. In this embodiment, the epitaxial layer 132 preferably includes silicon germanium, and the epitaxial layer could be formed by a selective epitaxial growth process through a single or multiple layer approach. Moreover, despite the ion implant for the source/drain 130 of the present embodiment being conducted before the formation of the epitaxial layer 132, the ion implant could also be performed after the epitaxial layer 132 is formed.

Next, a salicide process is performed by first forming a metal which is selected from a group consisting of cobalt, titanium, nickel, platinum, palladium, and molybdenum on the epitaxial layer 132 and the source/drain 130, and then using at least one rapid thermal anneal process to react the metal with the epitaxial layer 132 and the source/drain 130 for forming a silicide layer 134 on the surface of the epitaxial layer 132 and the source/drain 130 of the NMOS region 102 and the PMOS region 104. The un-reacted metal is removed thereafter.

Next, a cap layer 136, such as a contact etch stop layer with a suitable stress, is formed on the surface of the substrate 100 to cover the first gate structure 120 and the second gate structure 122, and an interlayer dielectric layer 138 is formed on the substrate 100 to cover both the NMOS region 102 and the PMOS region 104. A planarizing process, such as a chemical mechanical polishing (CMP) process is then performed to partially remove the inter layer dielectric 138, the cap layer 136, and the hard mask 118 and stop of the polysilicon layer 116, and an etching process is carried out thereafter to remove the polysilicon layer 116 from both NMOS region 102 and PMOS region 104 to form a gate trench 140 in the inter layer dielectric 138 within each region 102 and 104.

Figure 4:
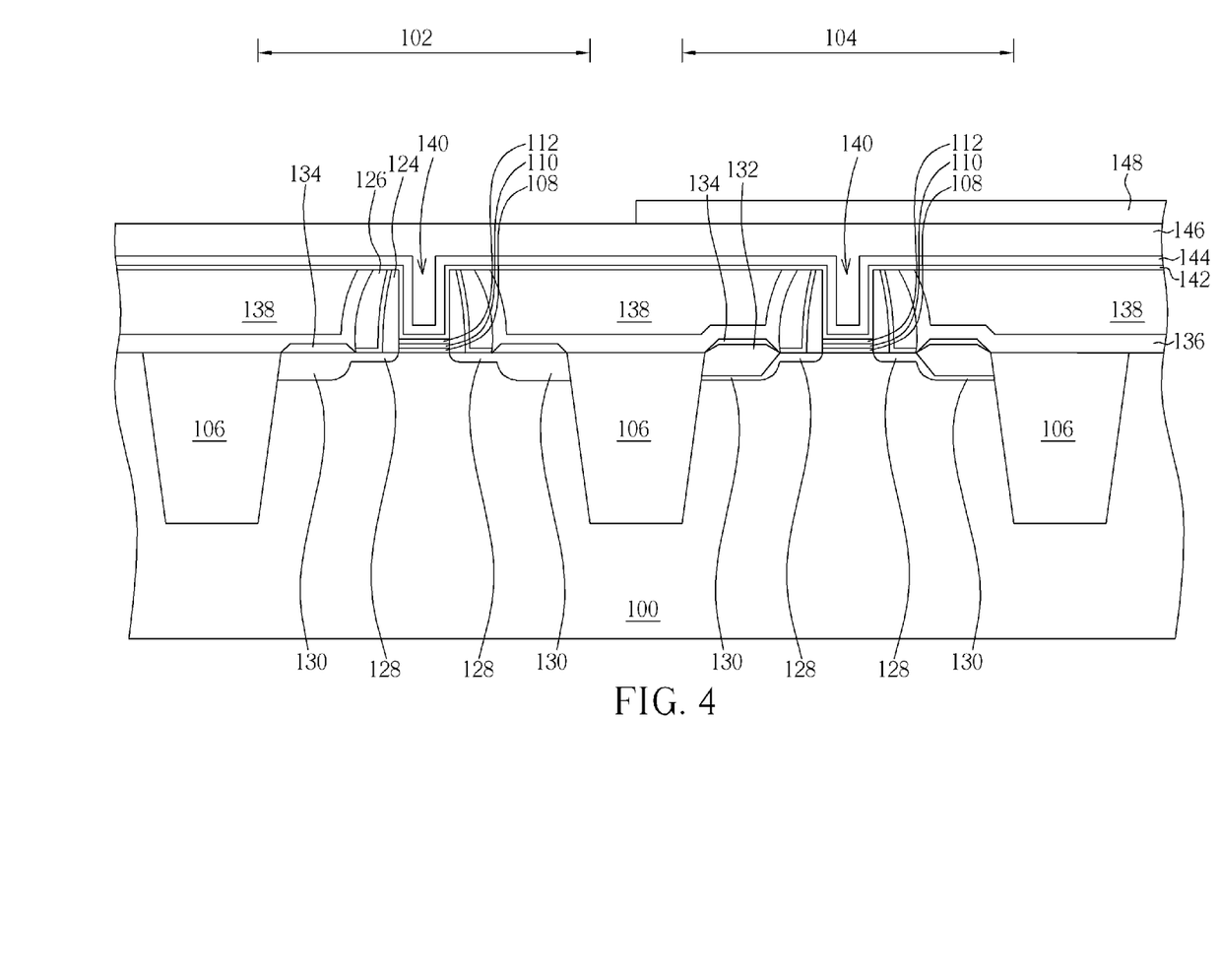

As shown in FIG. 4, an etching stop layer 142 and a p-type work function metal layer 144 are deposited on the inter layer dielectric 138 to cover the bottom and sidewall of each gate trench 140. Then, a dielectric layer or an anti-reflection layer 146 is formed on the surface of the P-type work function metal layer 144 and fills up each trench 140. Next, a patterned resist 148 is formed on the anti-reflection layer 146 within the PMOS region 104. The described P-type work function metal layer 144 may include titanium nitride, (TiN), titanium carbide (TiC), tantanum nitride (TaN), tantanum carbide (TaC), tungsten carbide (WC), or aluminum titanium nitride (TiAlN), but is not limited thereto. In addition, the p-type work function metal layer 144 may have a single layer or stacked layers. The etching stop layer 142 may include tantalum nitride (TaN) or the like.

Figure 5:
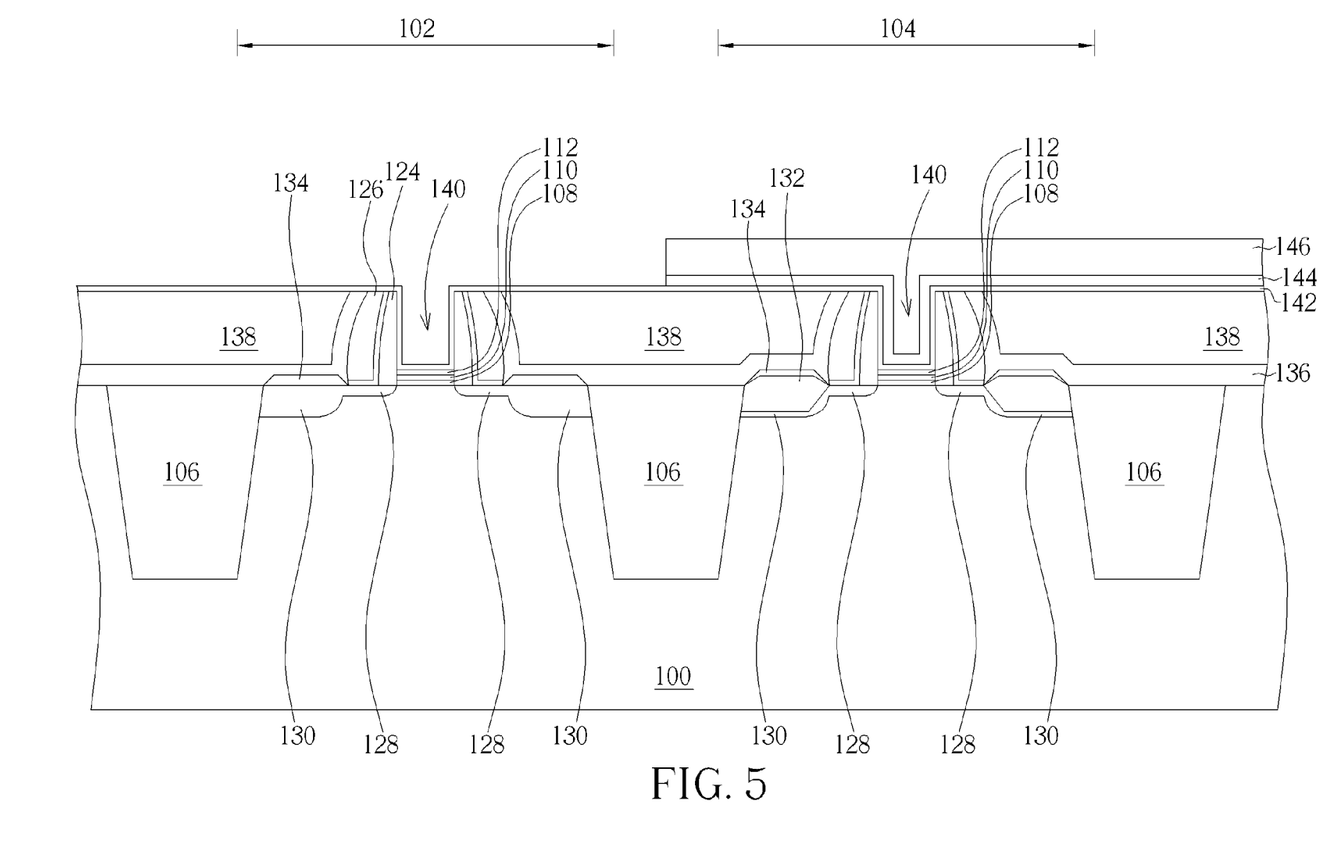

Next, as shown in FIG. 5, an etching process is performed by using the patterned resist 148 as a mask to remove the anti-reflection layer 146 and the P-type work function metal layer 144 in sequence within the NMOS region 102. Subsequently, all of the patterned resist 148 is stripped off, and the gate trench 140 with the etching stop layer 142 on the bottom and on the sidewalls of the gate trench 140 is formed within the NMOS region 102.

Figure 6:
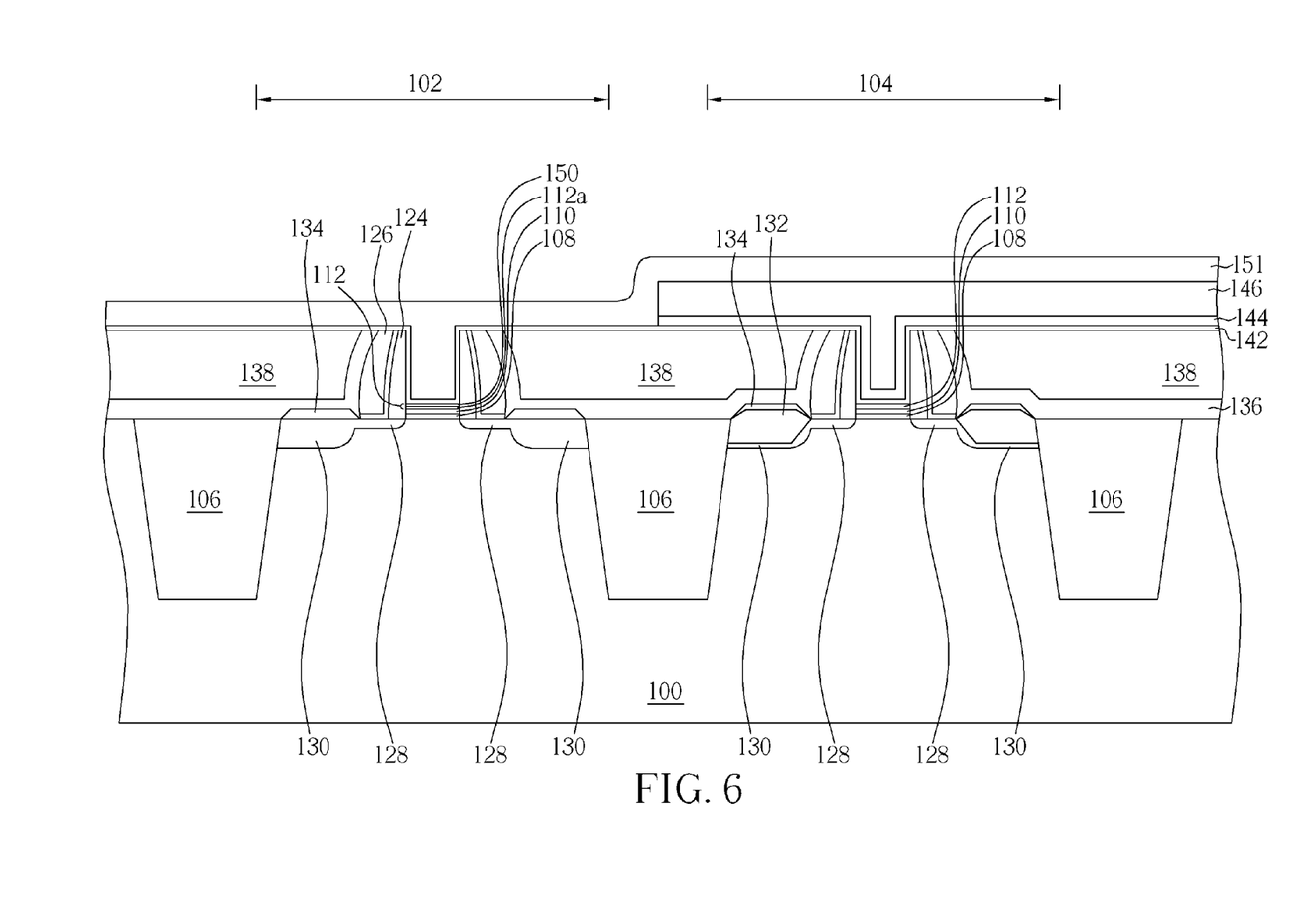

As shown in FIG. 6, a source layer 151 is formed which covers the surface of the anti-reflection layer 146 within the PMOS 104 region and fills the gate trench 140 within the NMOS 102. The composition of the source layer 151 includes elements or dopants, such as Al or rare earth elements. A drive-in process is performed, for example, a low temperature anneal with a temperature less than 420 degree C., to diffuse the elements or the dopants in the source layer into the barrier layer 112. During the described procedure, a portion or all the barrier layer 112 can be converted into an N-type work function metal layer 150. For example, according to the preferred embodiment of the present invention, an Al-based material is selected as the source layer 151. During the drive-in process with a temperature less than 400 degree C., the Al in the source layer 151 is capable of diffusing into the barrier layer 112 based on TiN, thereby forming a layer comprising TiAlN in the barrier layer 112. The above mentioned layer comprising TiAlN functions as the N-type work function metal layer 150. After the above drive-in process, the original barrier layer 112 becomes a residual second barrier layer 112$a$ and the newly converted N-type work function metal layer 150, wherein the N-type work function metal layer 150 is above the second barrier layer 112$a$. In addition, before performing the drive-in process, a cover metal layer may be disposed on the surface of the source layer 151 to avoid the source layer 151 reacting with materials in the environment during the drive-in process.

It is worth noting that the thickness of the N-type work function metal layer 150 is less than that of the barrier layer 112 and the diffusion depth of the dopants or the elements must not exceed the bottom of the barrier layer 112. In addition, after the drive-in process, the dopants or elements diffusing from the source layer 151 may reside in the etching stop layer 142 within the NMOS region 102; the following procedures, however, cannot incur the further diffusion of the elements or the dopants.

Figure 7:
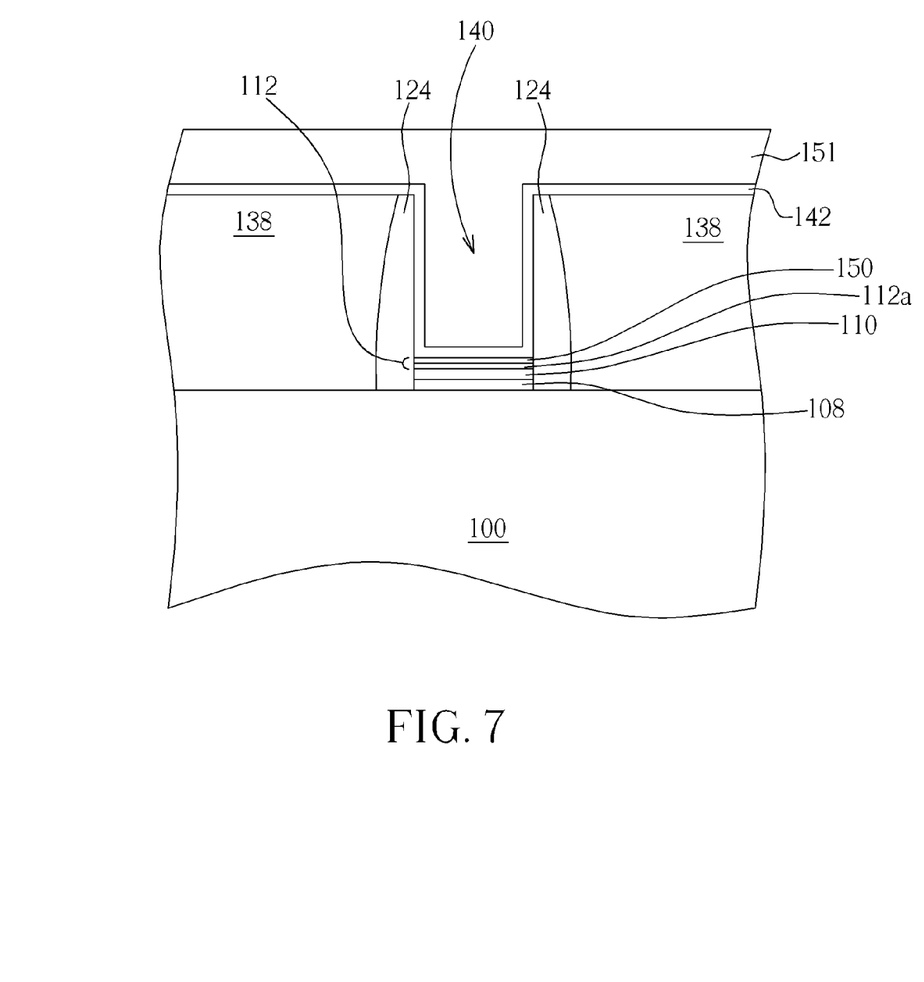

A procedure described here, in accordance with the present invention, adopts a gate-last procedure with a high-K first procedure. As shown in FIG. 7 which is a partially enlarged figure of FIG. 6, it can be seen that the I-shaped N-type work function metal layer 150 is disposed above the second barrier layer 112$a$. It should be noted that the thickness of the second barrier layer 112a is less than 20 angstroms, and the barrier layer 112 may fully convert into the N-type work function metal layer 150 by adjusting the parameters of the annealing procedure, e.g. annealing time or the like. In other words, the N-type work function metal layer 150 directly contacts with the high-k dielectric layer 110.

Figure 8:
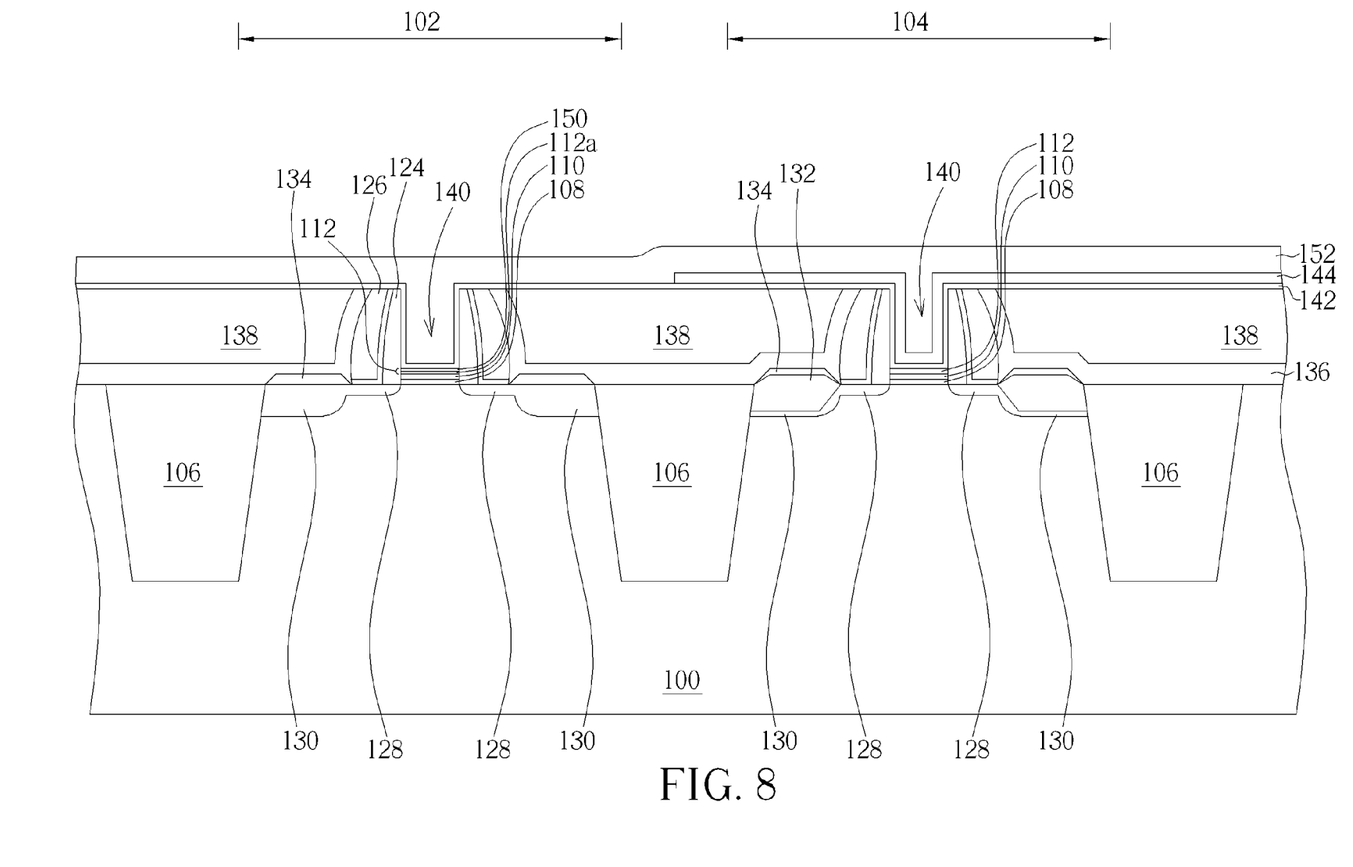

Next, as shown in FIG. 8, the source layer 151 and the anti-reflection layer 146 are removed to expose the etching stop layer 142 within the NMOS region 102 and the P-type work function layer 144 within PMOS region 104. It should be noted that the removal of the source layer 151 is for avoiding the further diffusion of the elements or dopants toward the high-k dielectric layer 110. It is well known that the work function value of the N-type work function metal layer 150 fluctuates according to the described further diffusion, and may influence threshold voltage of the NMOS or even incur the occurrence of the gate leakage current.

Then, as shown in FIG. 8, a conductive layer 152 with low resistance covers the inter layer dielectric 138 and fills the gate trenches 140. The conductive layer 152 is selected from a group consisting of a single metal Al, Ti, Ta, W, Nb, Mo, Cu, TiN, TiC, TaN, Ti/W, and composite metal such as Ti/TiN, but not limited thereto. It should be noted that the conductive layer 152 may further include an adhesive layer (not shown) and/or a barrier layer (not shown) and a metal layer (not shown). The adhesive layer and/or the barrier layer are disposed between the work function metal layer 144, 150 and the metal layer. The purpose of utilizing the adhesive layer and/or the barrier layer is to improve the adhesive and filling ability of the metal layer or to prevent the electromigration or the thermal diffusion of the elements in the metal layer. For instance, the process may adopt Ti/TiN or Ta/TaN as the adhesive layer when the metal layer includes W; alternatively, the process may adopt Ti/TiN or Ta/TaN as the barrier layer when the metal layer is Al or Cu.

Figure 9:
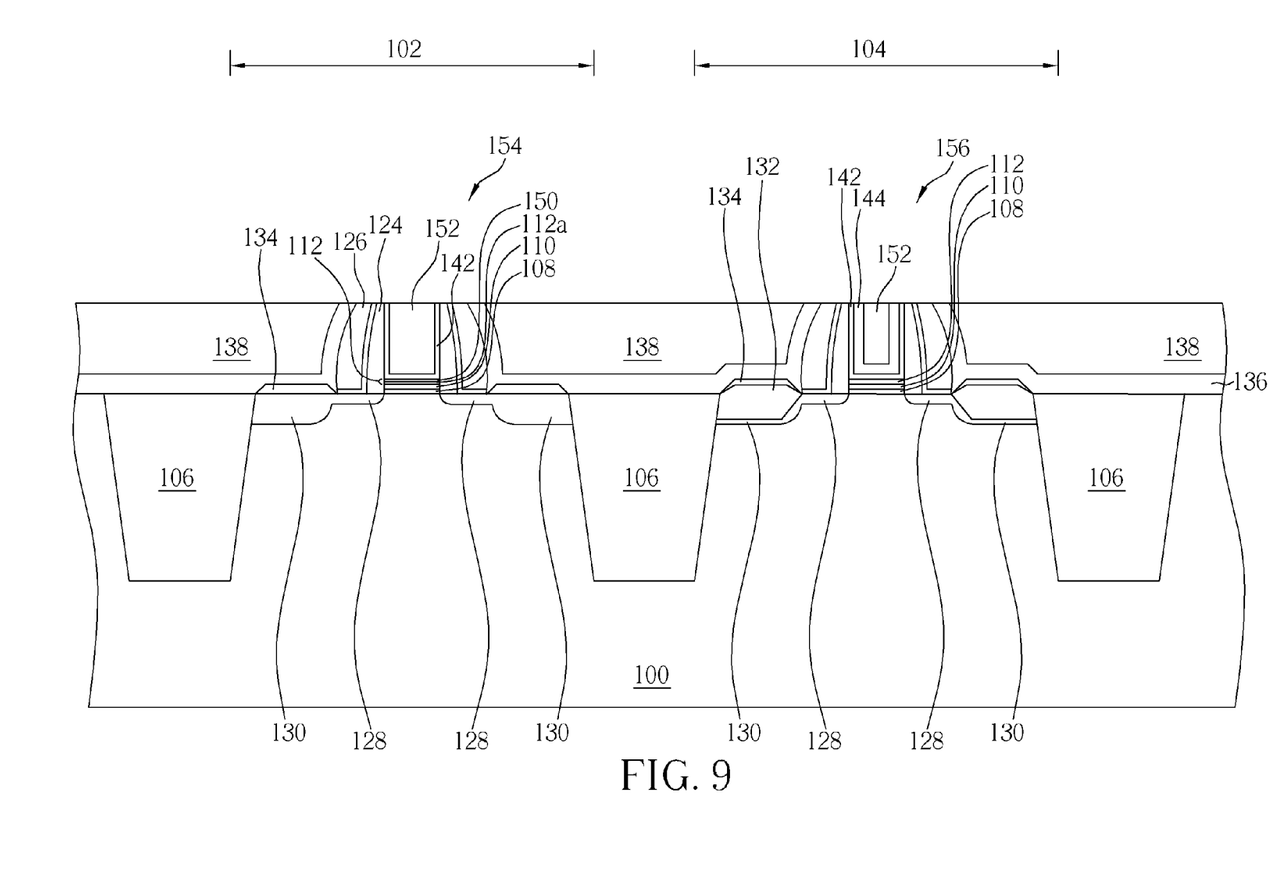
FIG. 9 is a schematic, cross-sectional diagram showing a metal gate structure in accordance with one embodiment of the invention.

As shown in FIG. 9, subsequent processes are performing one or multiple planarizing processes, such as CMP to partially remove the conductive layer 152, the p-type work function metal layer 144, and the etching stop layer 142, thereby forming a first metal gate 154 and a second metal gate 156 within the NMOS region 102 and PMOS region 104, respectively.

As a consequence, according to the embodiment of the invention, the metal gate 154 is provided, which includes the high-k dielectric layer 110 disposed on the substrate, the barrier layer 112 disposed on the high-k dielectric layer 110, the I-shaped N-type work function metal layer 150 disposed in the barrier layer 112, the conductive layer 152 with the U-shaped adhesive layer and/or the barrier layer in a cross-sectional view disposed on the N-type work function metal layer 150.

Figure 10:
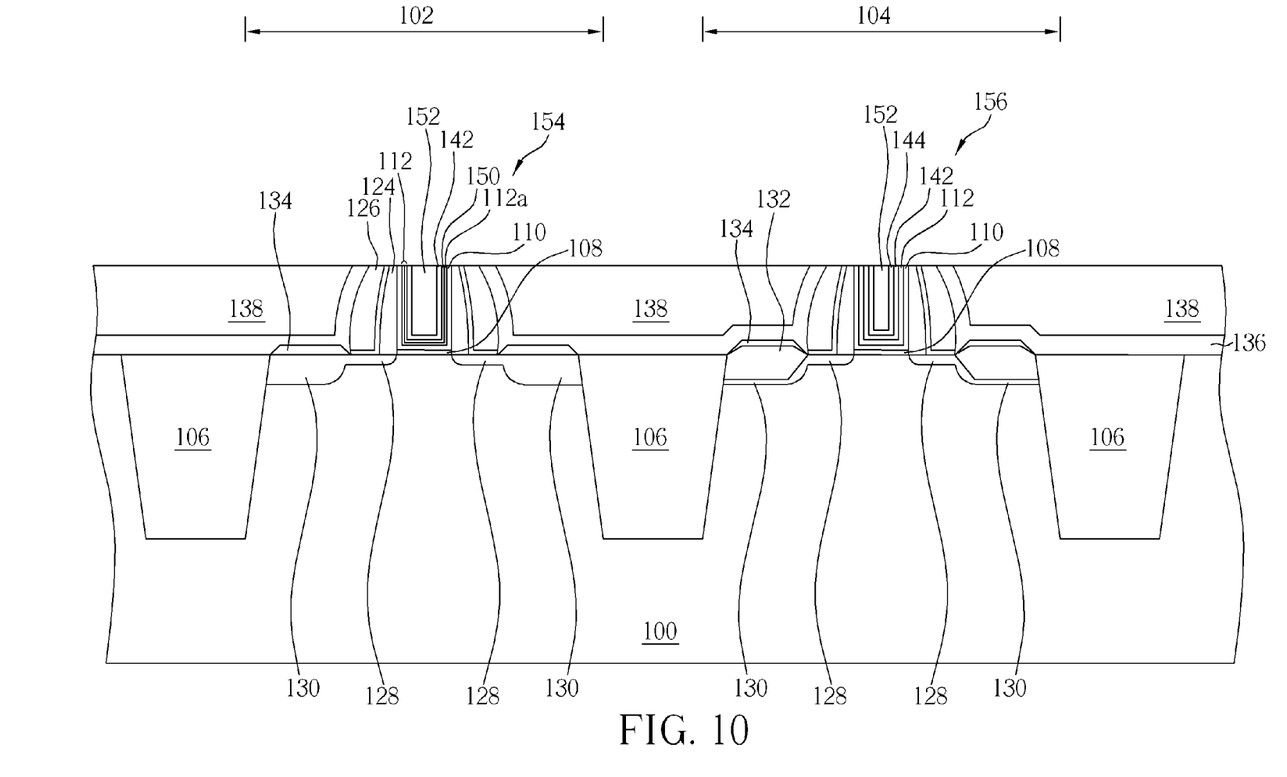
FIG. 10 is a schematic, cross-sectional diagram showing a metal gate structure in accordance with another embodiment of the invention.

It should be noted that, despite the aforementioned embodiment being applied to a high-k first process, the present invention could also be applied to a high-k last process. For instance, as shown in FIG. 10, a similar dummy gate of FIG. 2 could be first formed on a substrate 100, in which the dummy gate only includes an interfacial dielectric layer 108, a polysilicon layer 116, and a hard mask 118. Next, following a similar process carried out from FIG. 4, a first spacer 124 and a second spacer 126 are formed around the dummy gate, a lightly doped drain 128 and a source/drain 130 are formed in the substrate 100 adjacent to two sides of the first spacer 124 and second spacer 126, a cap layer 136 and an inter layer dielectric 138 are formed on the dummy gate and the substrate 100, a planarizing process is performed to partially remove the cap layer 136 and the inter layer dielectric 138, and the polysilicon layer 116 is removed from the dummy gate to form at least a trench gate 140 within a NMOS region 102 and a PMOS region 104. Next, a high-k dielectric fabrication could be performed, as shown in FIG. 4, to sequentially form a high-k dielectric layer 110, a barrier layer 112, and an etching stop layer 142 on the inter layer dielectric 138 within the NMOS region 102 and PMOS region 104.

Next, the following steps are performed based on the first embodiment of the invention. First, a P-type work function metal layer 144 is formed within the PMOS region 104. Then, a source layer 151 is formed within the NMOS region 102 and a drive-in process is carried out. The source layer 151 is removed. Next, a conductive layer 152 with low resistance is formed on the etching stop layer 142 and the P-type work function metal layer 144 and fills up the gate trenches 140. Finally, another planarizing process is performed to form metal gates 154, 156 within NMOS region 102 and PMOS region, respectively.

According to the other embodiment of the invention, it should be noted that, in the following drive-in processes, elements or dopants, e.g. Al or rare earth elements, are capable of diffusing from the source layer 151 into the barrier 112 to convert a portion or all of the barrier layer 112 into an N-type work function metal layer. Therefore, the thickness of the barrier layer 112 must be greater than 20 angstroms to prevent the elements or the dopants, e.g. Al or rare earth elements, from penetrating the bottom of the barrier layer 112.

Overall, the invention provides the structure of a metal gate and the fabrication method thereof. By removing the source layer within the NMOS, the elements such as Al or rare earth elements cannot diffuse into the work function metal layer or the substrate; therefore, a threshold voltage of the NMOS can be maintained in a constant value in an on-state and a gate leakage current can also be prevented. In addition, by performing a drive-in process, the distance between the N-type work function metal and the high-k dielectric layer can further be reduced, thereby improving the performance of the NMOS.

Those skilled in the art will readily observe that numerous modifications and alterations of the device and method may be made while retaining the teachings of the invention.

What is claimed is:

1. A method for fabricating a metal gate, comprising:
providing a substrate having an interfacial dielectric layer thereon;
forming a gate trench in the interfacial dielectric layer, wherein the gate trench has an I-shaped barrier layer;
forming a source layer on the I-shaped barrier layer;
driving at least an element from the source layer into the I-shaped barrier layer so as to convert a portion of the I-shaped barrier layer into an I-shaped work function metal layer, wherein a layer of the I-shaped barrier layer remains under the I-shaped work function metal layer after driving the element from the source layer into the I-shaped barrier layer;
removing the source layer; and
filling up the gate trench with a metal layer.

2. The method of claim 1, wherein the I-shaped barrier layer comprises TiN, and is thicker than 20 Angstroms.

3. The method of claim 1, wherein the source layer comprises aluminum or rare earth elements.

4. The method of claim 1, wherein a method for driving the element from the source layer into the I-shaped barrier layer comprises a low temperature annealing process performed at less than 420 degrees C.

5. The method of claim 1, wherein the gate trench further comprises a high-K dielectric layer located between the I-shaped barrier layer and the substrate, and the I-shaped barrier layer is in direct contact with the high-K dielectric layer.

6. The method of claim 5, wherein the high-K dielectric layer is selected from the group consisting of $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, SBT, PZT, BST, HfSiO, AlO, $Ta_2O_3$, ZrSiO, LaAlO, and HfZrO.

7. The method of claim 5, wherein the gate trench comprises at least an interfacial layer located between the high-k dielectric layer and the substrate.

8. The method of claim 1, further comprising:
before forming the source layer, forming an etching stop layer on a surface of the I-shaped barrier layer.

9. The method of claim 1, wherein the metal layer is a single layer or stacked layers comprising W, Al, Cu, Ti, Ta, Nb, Mo, TiN, TiC, TaN, Ti/W or Ti/TiN.

10. The method of claim 1, wherein the metal layer comprises a conductive layer including W and an adhesive layer selected from the group consisting of Ti, Ta, TiN, and TaN.

11. A method for fabricating a metal gate, comprising:
providing a substrate having an interfacial layer thereon, wherein the substrate is divided into a first region and a second region;

forming at least a gate trench in the interfacial layer within both of the first region and the second region, respectively, wherein the gate trenches have a barrier layer;

forming a source layer in the gate trench within the first region only, wherein the source layer is disposed on the barrier layer;

driving at least an element in the source layer into the barrier layer so as to convert a portion of the barrier layer into a work function metal layer, wherein a layer of the barrier layer remains under the work function metal layer after driving the element from the source layer into the barrier layer;

removing the source layer; and filling up the gate trenches with a metal layer.

12. The method of claim 11, wherein the first region is an N-type MOS region.

13. The method of claim 11, wherein the barrier layer comprises TiN.

14. The method of claim 11, wherein the source layer comprises Al or rare earth elements.

* * * * *